United States Patent
Richter et al.

(10) Patent No.: US 7,700,377 B2
(45) Date of Patent: Apr. 20, 2010

(54) METHOD FOR REDUCING ETCH-INDUCED PROCESS UNIFORMITIES BY OMITTING DEPOSITION OF AN ENDPOINT DETECTION LAYER DURING PATTERNING OF STRESSED OVERLAYERS IN A SEMICONDUCTOR DEVICE

(75) Inventors: Ralf Richter, Dresden (DE); Heike Salz, Radebeul (DE); Matthias Schaller, Moritzburg (DE)

(73) Assignee: GlobalFoundries, Inc., Grand Cayman (KY)

( * ) Notice: Subject to any disclaimer, the term of this patent is extended or adjusted under 35 U.S.C. 154(b) by 147 days.

(21) Appl. No.: 11/862,345

(22) Filed: Sep. 27, 2007

(65) Prior Publication Data

US 2008/0182346 A1 Jul. 31, 2008

(30) Foreign Application Priority Data

Jan. 31, 2007 (DE) .................... 10 2007 004 883

(51) Int. Cl.
*H01L 21/66* (2006.01)
(52) U.S. Cl. .................... 438/8; 438/199; 257/E21.528
(58) Field of Classification Search .................... 438/8
See application file for complete search history.

(56) References Cited

U.S. PATENT DOCUMENTS

| 6,258,497 | B1 | 7/2001 | Kropp et al. .................... 430/30 |
| 7,050,879 | B1 * | 5/2006 | Wang et al. .................... 700/121 |
| 2006/0091471 | A1 * | 5/2006 | Frohberg et al. ............. 257/369 |
| 2006/0226490 | A1 | 10/2006 | Burnett et al. .............. 257/365 |

FOREIGN PATENT DOCUMENTS

| DE | 102004026149 | 12/2005 |
| JP | 60251626 | 12/1985 |

OTHER PUBLICATIONS

German office action dated Sep. 27, 2007 for serial No. 102007004883.3-33.

* cited by examiner

*Primary Examiner*—Stephen W Smoot
(74) *Attorney, Agent, or Firm*—Williams, Morgan & Amerson, P.C.

(57) ABSTRACT

During the patterning of respective contact etch stop layers having a different type of intrinsic stress, the deposition of an etch indicator layer between the first and the second contact etch stop layer may be omitted in order to avoid any undue effects of this layer during the subsequent processing. Local removal of the second stressed layer may be performed on the basis of an etch time controlled etch process, which in some aspects may include the provision of an etch indicator material, wherein feed forward and feed back measurement data may be used in an appropriately designed process controller.

23 Claims, 7 Drawing Sheets

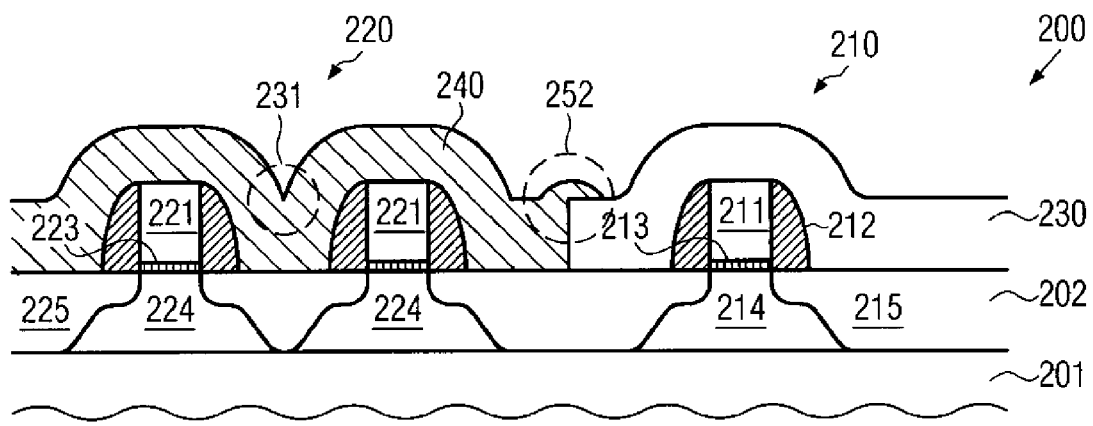
FIG. 2b
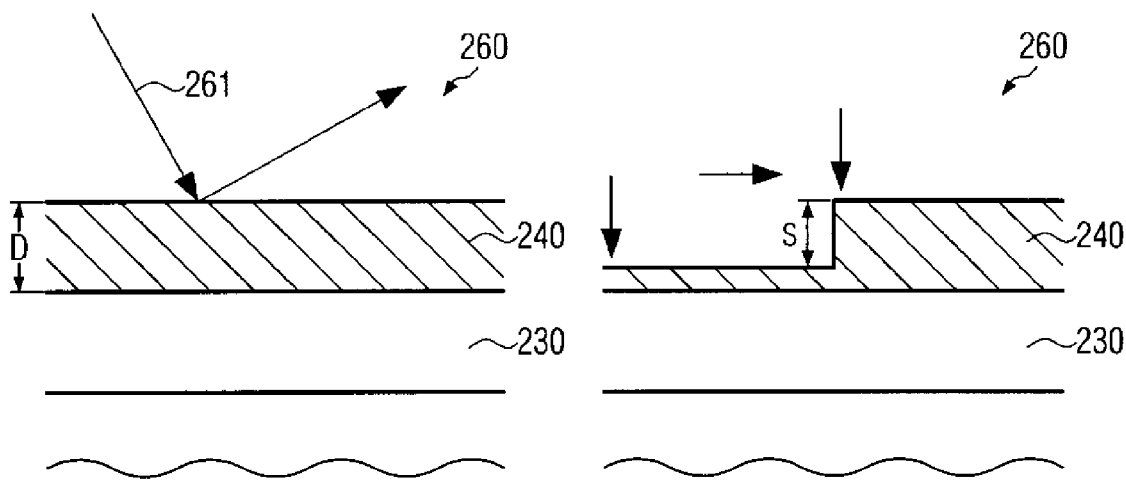
FIG. 2c
FIG. 2d

METHOD FOR REDUCING ETCH-INDUCED PROCESS UNIFORMITIES BY OMITTING DEPOSITION OF AN ENDPOINT DETECTION LAYER DURING PATTERNING OF STRESSED OVERLAYERS IN A SEMICONDUCTOR DEVICE

BACKGROUND OF THE INVENTION

1. Field of the Invention

Generally, the present disclosure relates to the field of integrated circuits, and, more particularly, to the manufacturing of field effect transistors on the basis of stressed dielectric layers formed above the transistors, such as stressed contact etch stop layers used for generating a different type of strain in channel regions of different transistor types.

2. Description of the Related Art

Integrated circuits are typically comprised of a large number of circuit elements located on a given chip area according to a specified circuit layout, wherein, in complex circuits, the field effect transistor represents one predominant circuit element. Generally, a plurality of process technologies are currently practiced, wherein, for complex circuitry based on field effect transistors, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, renders the channel length a dominant design criteria for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in a reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. For example, the lattice structure in the channel region may be modified, for instance, by creating tensile or compressive strain therein, which results in a modified mobility for electrons and holes, respectively. For example, creating tensile strain in the channel region of a silicon layer having a standard crystallographic configuration may increase the mobility of electrons, which, in turn, may directly translate into a corresponding increase of the conductivity of N-type transistors. On the other hand, compressive strain in the channel region may increase the mobility of holes, thereby providing the potential for enhancing the performance of P-type transistors.

One promising approach in this respect is a technique that enables the creation of desired stress conditions within the channel region of different transistor elements by adjusting the stress characteristics of a contact etch stop layer that is formed above the basic transistor structure in order to form contact openings to the gate and drain and source terminals in an interlayer dielectric material. The effective control of mechanical stress in the channel region, i.e., effective stress engineering, may be accomplished by individually adjusting the internal stress in the contact etch stop layer of the respective transistor in order to position a contact etch stop layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be used, due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher of compressive stress and up to 1 GPa and significantly higher of tensile stress, wherein the type and the magnitude of the intrinsic stress may be efficiently adjusted by selecting appropriate deposition parameters. For example, ion bombardment, deposition pressure, substrate temperature, gas components and the like represent respective parameters that may be used for obtaining the desired intrinsic stress.

During the formation of the two types of stressed layers, conventional techniques may suffer from reduced efficiency when device dimensions are increasingly scaled using the 65 nm technology and even further advanced approaches, as will be explained in more detail with reference to FIG. 1a-1c.

FIG. 1a schematically illustrates a cross-sectional view of a semiconductor device 100 in a certain manufacturing stage for forming stress-inducing layers above a first device area 110 and a second device area 120. The first and second device areas 110, 120 which typically represent respective transistor elements may be formed above a substrate 101 comprising a semiconductor layer 102, such as a silicon-based layer, which may be separated from the substrate 101 by an appropriate buried insulating layer if a silicon-on-insulator (SOI) configuration is considered. In the example shown, the second device area 120 may comprise a plurality of transistor elements, while only a single transistor is illustrated in the first device region 110. The transistors in the second device region 120 may comprise a gate electrode 121 formed on a respective gate insulation layers 123, which separates the gate electrode 121 from a corresponding channel region 124, which is laterally located between respective drain/source regions 125. Furthermore, a sidewall spacer structure 122 may be formed on sidewalls of the gate electrode 121. Typically, metal silicide regions (not shown) may be provided in the drain and source regions 125 and the gate electrodes 121 in order to enhance the conductivity of these areas. The semiconductor device 100 may represent an advanced device, in which critical dimensions, such as the gate length, i.e., in FIG. 1a the horizontal extension of the gate electrodes 121, may be approximately 50 nm or significantly less. Consequently, a distance between respective transistor elements, i.e., the lateral distance between neighboring sidewall spacer structures 122 of closely spaced transistor elements may be approximately 100 nm or even less, wherein, depending on the device configuration, in dense device areas, a plurality of closely spaced circuit elements may be provided.

In the first device region 110, the respective transistor element may have a similar configuration and may represent a transistor of a different conductivity type compared to the transistors in the second device region 120, depending on the device requirements. Thus, a respective gate electrode 111 formed on a gate insulation layer 113, separating the gate electrode 111 from a channel region 114, may be provided. A spacer sidewall structure 112 may be formed on sidewalls of the gate electrode 111 and respective drain/source regions 115 may be formed in the semiconductor layer 102. It should be appreciated that the first and second device regions 110, 120 may be separated by an appropriate isolation structure (not shown) if required. Furthermore, in the manufacturing stage shown in FIG. 1a, a silicon nitride layer 130 comprising a high intrinsic stress may be formed above the first and second device regions 110, 120 followed by an etch indicator layer 131 comprised of silicon dioxide. It should be appreciated that, if required, an etch stop layer (not shown), such as a silicon dioxide layer of appropriate thickness and density, may be provided between the silicon nitride layer 130 and the respective transistor elements in the first and second device regions 110, 120.

As is evident from FIG. 1a, due to the reduced spacing between neighboring transistor elements, as is for instance shown in the second device area 120, the silicon nitride layer 130 may define a respective surface topography in which tapered recesses, also referred to as seams 131, may be formed between the closely spaced transistor elements, since the spacing between the transistor elements may be on the order of two times a layer thickness of the silicon nitride layer 130. Thus, due to the pronounced surface topography at the seam 131, the silicon dioxide layer 132 may have a significantly increased thickness at this area, due to locally different deposition conditions compared to other areas, which may result in significant etch non-uniformities, as will be described with reference to FIG. 1b.

Furthermore, in this manufacturing stage, the semiconductor device 100 may comprise a resist mask 103 exposing the second device region 120, while covering the first device region 110. In this case, it may be assumed that the intrinsic stress of the silicon nitride layer 130 may be appropriately selected so as to enhance the transistor performance in the first device region 110.

A typical process flow for forming the semiconductor device 100 as shown in FIG. 1a may comprise the following processes. The gate electrodes 121, 111 and the gate insulation layers 123, 113 may be formed and patterned on the basis of well-established process techniques, including advanced photolithography, deposition, oxidation and etch techniques. Thereafter, the drain and source regions 125, 115 may be formed in combination with the sidewall spacer structures 122, 112 on the basis of well-established deposition, anisotropic etch processes and implantation sequences in order to establish the desired vertical and lateral dopant profile. Thereafter, respective silicide regions (not shown) may be formed, if required, on the basis of well-established techniques. Thereafter, if required, a corresponding silicon dioxide etch stop layer (not shown) may be formed followed by the deposition of the silicon nitride layer 130. During the deposition of the silicon nitride material, respective process parameters, such as composition of carrier gases and reactive gases, substrate temperature, deposition pressure and in particular ion bombardment during the deposition, may significantly influence the finally obtained intrinsic stress of the material as deposited with respect to the underlying materials. Thus, by selecting appropriate parameter values, a high degree of intrinsic stress, such as up to 2 Gigapascal (GPa), and even more of compressive stress or up to 1 GPa or even significantly higher of tensile stress, may be created so as to enhance the performance of the transistor in the first device region 110. Due to the less pronounced conformality of the silicon nitride deposition process and due to the reduced distance between the neighboring transistor elements in densely packed device areas, such as the second device region 120, the silicon nitride material may merge in the lateral growth direction between closely spaced transistor elements, thereby forming the respective seam 131. Thus, in the subsequent deposition of the silicon dioxide layer 132, the local deposition conditions at the seam 131 may result in a non-uniformity of the layer thickness, thereby creating a locally significantly enhanced silicon dioxide thickness, which may even amount to a thickness of up to three to four times the thickness of the silicon dioxide layer 132 at areas distant from the seam 131.

After the deposition of the silicon dioxide layer 132, the resist mask 103 may be formed on the basis of well-established photolithography techniques. Next, an appropriately designed etch process may be performed in order to remove a portion of the layers 130 and 132 from the second device region 120. During the corresponding etch process, the silicon dioxide material of the layer 132 may be removed first, followed by a selective etch process for removing the material of the silicon nitride layer 130, wherein the corresponding etch process may be controlled on the basis of an etch stop layer, if required. Due to the significantly increased layer thickness of the silicon dioxide layer 132 at the seam 131, the material may not be completely removed during the etch process when removing the layer 132, thereby significantly blocking the selective etch chemistry during the subsequent etch process for removing the exposed portion of the silicon nitride layer 130.

FIG. 1b schematically illustrates the semiconductor device 100 after the corresponding etch process. Hence, after removal of the resist mask 103, the silicon nitride layer 130 may be formed above the first device region 110 including the silicon dioxide layer 132, while the corresponding transistor elements in the second device region 120 are substantially exposed, except for respective material residues 133 caused by respective non-uniformities of the preceding etch process at the seam 131, as previously explained. During the further processing, i.e., the deposition of a silicon nitride layer having a different intrinsic stress above the first and second device areas 110, 120 and removing the corresponding silicon nitride layer from the first device region 110 by an etch process controlled on the basis of the etch indicator layer 132, the residues 133 may result in significant process non-uniformities, creating respective material residues when forming a contact opening at the seam 131, which may finally result in a reduced transistor performance or even a contact failure. Consequently, in sophisticated applications, the conventional process sequence for providing silicon nitride layers of different intrinsic stress may no longer be appropriate, in particular when transistor dimensions are further scaled down.

FIG. 1c schematically illustrates the semiconductor device 100 in an advanced manufacturing stage in order to demonstrate further issues associated with the conventional process sequence for forming silicon nitride layers of different intrinsic stress. In this manufacturing stage, the device region 110 may comprise a silicon nitride layer 130 and the silicon dioxide layer 132, while the transistors of the second device region 120 have formed thereabove a second silicon nitride layer 140 having a different type of intrinsic stress. Moreover, an interlayer dielectric material, such as a silicon dioxide material 150, may be provided, followed by a respective resist mask 106 in order to define respective openings for forming a contact opening 151 in the interlayer dielectric material 150. The second silicon nitride layer 140 may be formed on the basis of an appropriately controlled deposition process, as previously described, followed by an etch process for removing the layer 140 from above the first device region 110, controlled by the etch indicator layer 132 in order to identify the end of the corresponding etch process. That is, during the etching of the non-covered material of the layer 140 above the first device region 110, the etch front may finally reach the etch indicator layer 132, thereby releasing a certain degree of byproducts into the etch ambient, which may be efficiently detected by optical endpoint detection systems. Consequently, the corresponding etch process may be controlled on the basis of this endpoint detection signal in order to substantially completely remove the unwanted material of the layer 140, while not unduly removing any material of the silicon nitride layer 130.

Thereafter, the interlayer dielectric material 150 may be formed on the basis of well-established techniques followed by forming the resist mask 106. Next, an anisotropic etch process may be performed in which the layers 130, 140 may efficiently act as etch stop layers. In a subsequent etch process on the basis of a different etch chemistry, the layers 130 and 140 may be opened so as to provide an opening extending to the respective contact areas of the transistor elements. However, at areas in which an overlap of the two silicon nitride layers 130, 140 may occur, indicated as 152, the corresponding silicon dioxide layer 132 may not be efficiently removed during the etch step for etching through the material of the layer 150 in order to form a respective contact opening therein, such as the opening 151. Consequently, during the subsequent etch process for opening the silicon nitride material, the corresponding etch process encounters a layer stack comprised of nitride and oxide, which may result in a significantly different etch behavior compared to other areas in which a single nitride layer has to be opened. Consequently, the corresponding last process step for opening the nitride material may have a significantly increased complexity, thereby resulting in significant etch damage in areas having a single nitride layer or resulting in non-removed dielectric materials at the area 152. As a result, the conventional process strategy for forming silicon nitride layers of different intrinsic stress may yield respective non-uniformities, such as material residues 133 and/or contact non-uniformities caused by the complex layer stack at overlap regions 152, thereby also causing respective non-uniformities of the transistor performance.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, embodiments disclosed herein are directed to process techniques for forming stressed dielectric layers above respective transistor elements, wherein efficient process control during the selective removal of unwanted dielectric layer portions may be provided while additionally process non-uniformities caused by conventional etch indicator layers may be significantly reduced or even completely avoided. This may be accomplished by avoiding the deposition of a corresponding etch indicator layer and/or by providing an indicator material on the basis of techniques other than deposition techniques, such as implantation, plasma treatment and the like.

According to one illustrative embodiment, a method comprises forming a first stress-inducing layer above a first transistor and a second transistor that are formed above a substrate. The method further comprises removing a portion of the first stress-inducing layer located above the second transistor and forming a second stress-inducing layer on the first stress-inducing layer. Finally, a portion of the second stress-inducing layer is removed from above the first transistor on the basis of an etch time controlled etch process.

According to another illustrative embodiment, a method comprises implanting a species with a specified energy into a dielectric material formed above a first transistor and a second transistor, wherein the dielectric material is comprised of a first stress-inducing layer selectively formed above the first transistor and a second stress-inducing layer formed on the first stress-inducing layer and above the second transistor. Moreover, the method comprises removing the second stress-inducing layer by an etch process controlled on the basis of a signal generated by the implanted species.

According to a further illustrative embodiment, a method comprises forming a first dielectric layer above a first transistor and a second transistor of a semiconductor device and introducing an indicator species into the first dielectric layer with a specified mean penetration depth. Furthermore, the first dielectric layer is removed from the second transistor and a second dielectric layer is formed on the first dielectric layer and above the second transistor. Finally, the second dielectric layer is removed from the first dielectric layer by an etch process controlled on the basis of a signal generated by the indicator species.

BRIEF DESCRIPTION OF THE DRAWINGS

The disclosure may be understood by reference to the following description taken in conjunction with the accompanying drawings, in which like reference numerals identify like elements, and in which:

FIGS. 2a-2d schematically illustrate cross-sectional views of a semiconductor device during various manufacturing stages for forming stress-inducing layers of different intrinsic stress while avoiding the deposition of an etch indicator layer according to illustrative embodiments;

Figure 1A:
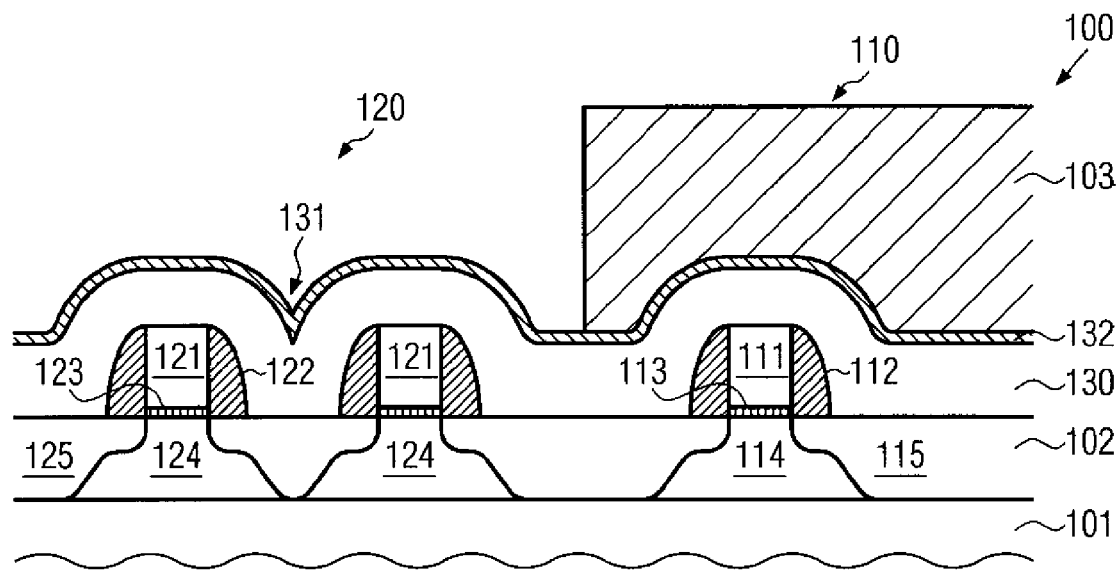
FIGS. 1a-1c schematically illustrate cross-sectional views of a conventional semiconductor device during various manufacturing stages in forming silicon nitride layers of different intrinsic stress on the basis of a silicon dioxide etch indicator layer resulting in process non-uniformities.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to an enhanced process flow for forming stress-inducing layers above respective transistor elements by avoiding the deposition of a corresponding etch indicator layer between the first and second stress-inducing layers, as is previously explained with reference to the device 100. Consequently, the corresponding surface topography caused by the overall dimensions of the semiconductor device under consideration and the gap fill capabilities of the respective deposition process for forming the highly stressed dielectric material may not significantly affect the further processing, such as the etch process for removing unwanted layer portions of the stressed dielectric material and/or the formation of respective contact openings in a subsequent manufacturing stage. In some aspects of the present disclosure, this may be accomplished by omitting the etch indicator layer and performing the corresponding etch process on the basis of a controlled etch time including the assessment of respective measurement data obtained on the basis of pre-etch measurements and/or post-etch measurements, wherein, in some illustrative embodiments, both types of measurement data may be used, thereby establishing a feed forward and a feed back control loop. On the basis of the respective measurement data, process variations with respect to a thickness fluctuation of the corresponding dielectric material and/or the etch rate of the etch process under consideration may be highly efficiently compensated for, thereby providing the potential for reliably and substantially completely removing unwanted dielectric material without significantly affecting the lower-lying dielectric material of a different type of intrinsic stress. Respective measurement data may be obtained on the basis of well-established metrology techniques, thereby not unduly contributing to process complexity. Furthermore, since a high degree of compatibility with conventional process sequences may be maintained, except for the omission of the deposition process, the overall throughput may not be negatively affected and may even be further enhanced due to the reduced number of process steps compared to the conventional strategy which requires the additional deposition of the silicon dioxide etch indicator layer, as is previously explained.

Additionally or alternatively, in some aspects of the present disclosure, the controllability of the respective etch process may be enhanced or may be provided by an indicator species, which may be appropriately incorporated into the dielectric material in order to provide a prominent endpoint detection signal that may be used for controlling the respective etch process. For example, appropriate implantation or plasma treatment techniques may be used in order to incorporate the respective indicator species at any appropriate manufacturing stage, wherein even very "exotic" species may be used in order to obtain an efficiently detectable endpoint detection signal, while requiring only a minor concentration of the respective indicator species. In this way, any influence caused by the process of incorporating the indicator species may be maintained at a lower level while nevertheless providing enhanced controllability of the etch process. Since the corresponding processes, such as implantation and plasma treatment, may have a significantly different behavior compared to the deposition scenario for forming the silicon dioxide etch stop layer, in combination with a moderately low concentration of the indicator species, any negative impact caused by the respective surface topography may not substantially affect the process uniformity, i.e., the process of detecting the endpoint detection signal in the subsequent etch process.

Consequently, even for highly scaled semiconductor devices of the 65 nm technology node and beyond, an efficient strain-inducing mechanism may be established on the basis of respective stress-inducing overlayers while avoiding or at least reducing any non-uniformities caused by the presence of a deposited silicon dioxide layer.

Figure 2A:
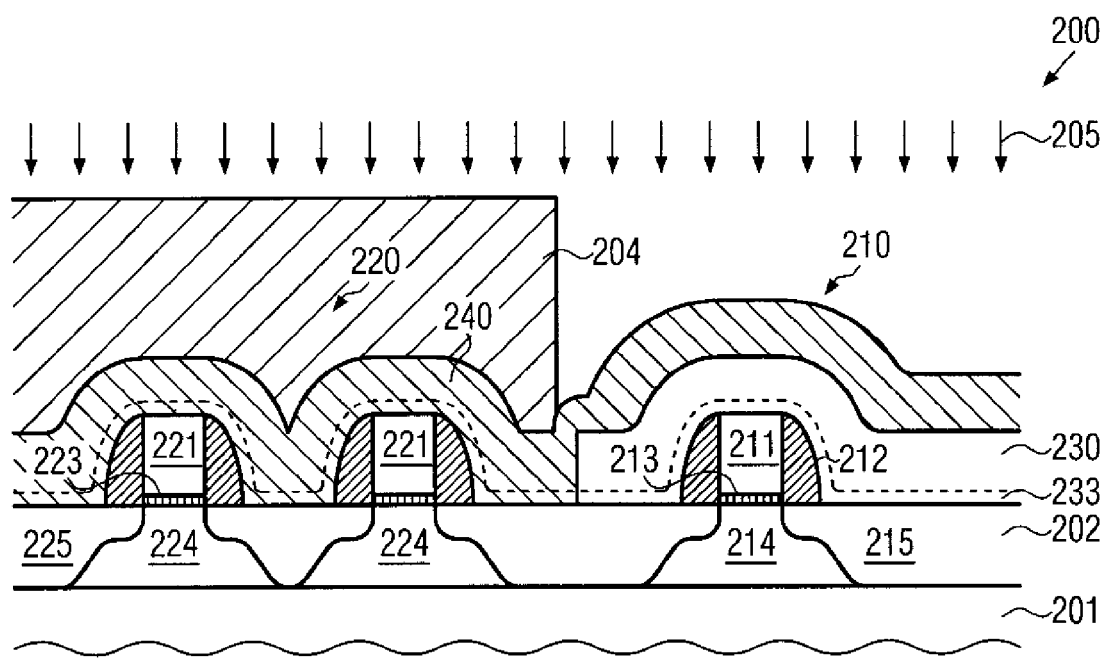

FIG. 2a schematically illustrates a cross-sectional view of a semiconductor device 200 comprising a first device region 210 and a second device region 220 that are formed above a substrate 201 having formed thereon a semiconductor layer 202. The substrate 201 may represent any appropriate carrier material, such as a semiconductor bulk substrate, for instance on the basis of silicon, or an insulating material having formed thereon the substantially crystalline semiconductor layer 202. For example, the layer 202 and the substrate 201 may constitute an SOI configuration on the basis of a corresponding buried insulating layer (not shown). The first and second device regions 210, 220 may comprise one or more respective transistor elements 210T, 220T, respectively. For example, in the first device region 210, the corresponding transistor 210T may comprise a gate electrode 211 formed on a gate insulation layer 213 separating the gate electrode 211 from a corresponding channel region 214. Respective drain and source regions 215 may be formed on the basis of an appropriate dopant profile within the layer 202. Furthermore, a respective sidewall spacer structure 212 may be formed on sidewalls of the gate electrode 211. Similarly, the one or more transistors 220T in the second device region 220 may comprise a gate electrode 212, a gate insulation layer 223, a channel region 224, drain and source regions 225 and a sidewall spacer structure 222. Furthermore, respective feature sizes may include minimal dimensions of 50 nm and significantly less, as is previously also explained with reference to the semiconductor device 100. For instance, the portion of the second device region 220 illustrated may represent a densely packed area with reduced lateral distances between neighboring transistors, as is previously explained. It should be appreciated that respective dense areas may also exist in the first device region 210. Furthermore, in this manufacturing stage, the semiconductor device 200 may comprise a first stress-inducing layer 230, which may be comprised of any appropriate dielectric material that enables the creation of a respective high intrinsic stress. In one illustrative embodiment, the first stress-inducing layer 230 may be comprised of silicon nitride in any appropriate configuration so as to exhibit the desired high degree of intrinsic stress in the first device region 210, that is, above a first transistor 210T provided therein. Furthermore, a second stress-inducing layer 240 is formed on the first layer 230 and above the one or more second transistors 220T, i.e., above the second device region 220. The second stress-inducing layer 240 may be comprised of any appropriate material, such as silicon nitride and the like, wherein, in illustrative embodiments, the material composition of the first and second layers 230, 240 may be similar with respect to atomic species, however the density, the amount of hydrogen and the like may vary so as to provide different types of intrinsic stress. In one illustrative embodiment, an optional etch stop layer 233, indicated in dashed lines, may be formed below the first and/or the second stress-inducing layers 230, 240 while, in other embodiments, the corresponding etch stop layer 233 may be omitted. Furthermore, in this manufacturing stage, an etch mask 204, such as a resist mask, may be provided in order to expose the first device region 210 and cover the second device region 220.

Figure 1B:
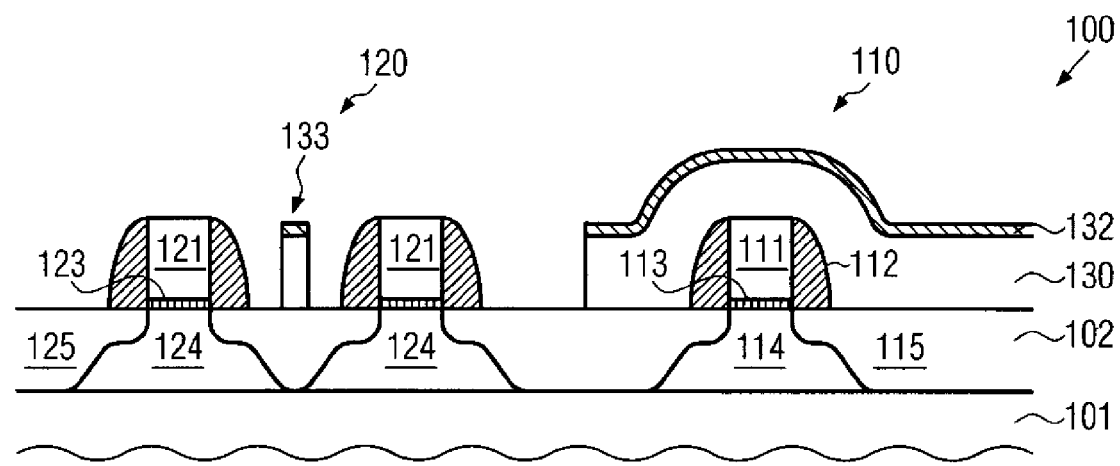
Figure 1C:
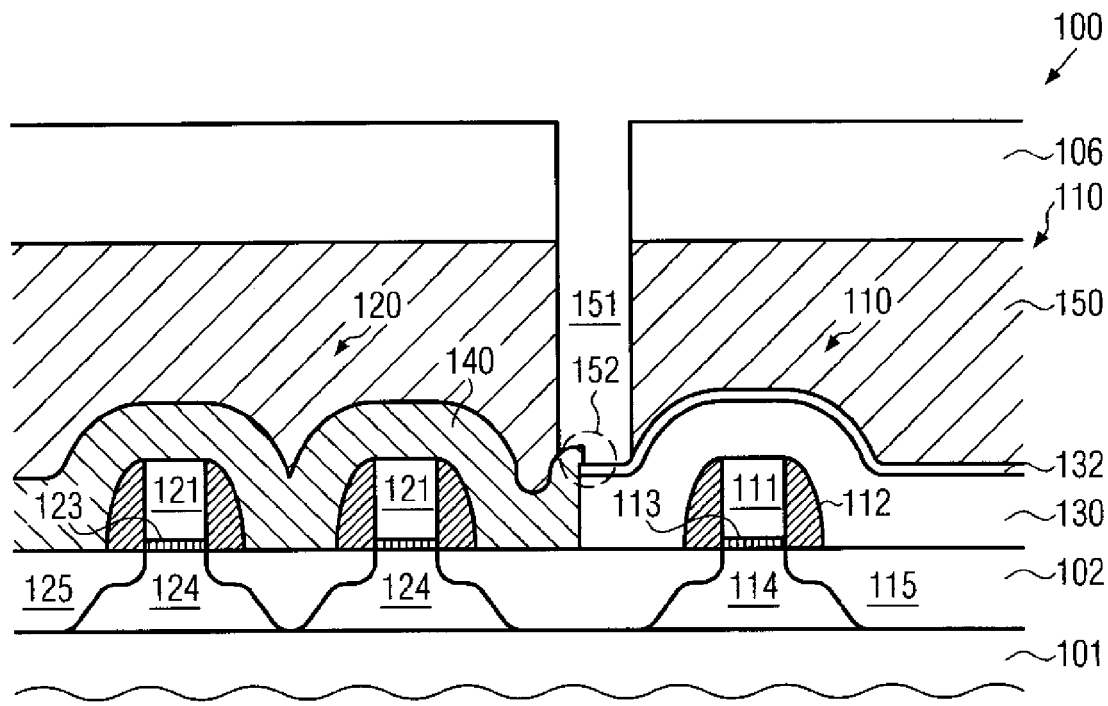

A typical process for forming the semiconductor device 200 as shown in FIG. 2a may comprise similar manufacturing techniques as are previously described with reference to device 100 except for the omission of the deposition of an etch indicator layer, such as the silicon dioxide layer 132, as shown in FIGS. 1a-1c. Thus, the transistor devices 210T, 220T in the first and second device regions 210, 220, respectively, may be formed on the basis of well-established techniques, which may also include respective silicidation process regimes, wherein, for convenience, any such metal silicide regions are not shown in FIG. 2a. After completing the basic transistor configuration, the optional etch stop layer 233 may be formed, for instance, as a silicon dioxide layer having a sufficient thickness for reliably stopping a subsequent etch process for patterning the first stress-inducing layer 230. In other cases, the layer 233 may be omitted or may be formed so as to provide an efficient endpoint detection signal while not requiring completely stopping the corresponding etch process. In still other illustrative embodiments, the etch stop layer 233 may be patterned so as to expose the first device region 210 prior to the deposition of the layer 230 in order to enhance the stress transfer mechanism from the first dielectric layer 230 into the respective channel region 214. Next, the layer 230 may be deposited on the basis of appropriate deposition techniques, controlled by appropriate process parameters in order to obtain a specified intrinsic stress and an appropriate layer thickness. Thereafter, the layer 230 may be patterned on the basis of a corresponding etch process, as previously described with reference to FIG. 1a, wherein a corresponding etch process may be performed with reduced complexity due to the missing silicon dioxide layer 132 (FIG. 1a). The corresponding etch process may be controlled on the basis of the layer 233, if provided, or may use the selectivity to the respective metal silicide regions, if provided. In other cases, the etch process may be stopped or controlled on the basis of the layer 233 and thereafter the layer 233 may be removed, if required. Consequently, contrary to the conventional strategy as shown in FIG. 1b, any material residues, such as the residues 133, may be substantially avoided irrespective of the complex surface topography created by the deposition process for forming the first layer 230.

Next, the second layer 240 may be deposited on the basis of any appropriate technique, for instance PECVD if, for instance, silicon nitride is used. Thus, in the illustrative embodiment shown, the layers 230 and 240 may contain substantially the same atomic species, however, with a varying composition and molecular structure so as to provide the different types of intrinsic stress. However, in a corresponding etch process on the basis of the etch mask 204, which may be formed, for instance, by well-established photolithography techniques, a pronounced endpoint detection signal may not be observed due to the similarity of the respective volatile byproducts created during the etch process, when the etch front advances, during removal of the layer 240, to the layer 230. In this case, an etch process 205 may be used which may be controlled on the basis of the etch time in order to substantially completely remove the exposed portions of the layer 240, while not unduly removing material of the layer 230. The etch time controlled process 205 may be established on the basis of respective measurement data, as will be described later on in more detail with reference to FIGS. 2c-2e in order to account for process variations in forming the layer 240 and/or etch rate variations of the process 205, which may exist between several substrates processed in the same or different process chambers. Consequently, after having adjusted the etch time of the process 205, the layer 240 may be substantially completely removed from above the first device region 210.

FIG. 2b schematically illustrates the semiconductor device 200 after the etch process 205 and the removal of the etch mask 204. Consequently, a high degree of homogeneity in the material composition may be accomplished in the semiconductor device 200 with respect to the layers 230 and 240, even at critical locations such as an area 231 corresponding to the seam created during the deposition of the first and second layers 230, 240 (FIG. 1a), and also an area 252 corresponding to an overlay region of the first and second layers 230, 240, which may now be comprised of substantially the same materials, since any intermediate etch indicator layer portion may not be present.

Thus, the further processing, i.e., the deposition of an interlayer dielectric material and the subsequent patterning of the interlayer dielectric material and the first and second layers 230, 240 may be performed on the basis of well-established etch regimes with enhanced uniformity, thereby providing the potential for further scaling the feature sizes on the basis of well-established process techniques.

FIG. 2c schematically illustrates a measurement site 260 which may be located at any appropriate position in the semiconductor device 200 so that the measurement site 260 may be accessed by, for instance, an optical measurement process, indicated as 261, in order to determine the thickness D of at least the second layer 240 after deposition. For example, the measurement site 260 may also comprise the layer 230, the thickness of which may have also been determined in a previous measurement process after deposition so as to enable the determination of the thickness of the layer 240 on the basis of an optical measurement technique, even if the optical response of the layers 230 and 240 may be similar. For instance, well-established ellipsometry techniques may be used in order to obtain the thickness of the layer 240.

A respective thickness measurement data may be used in determining an appropriate target etch time for the etch process 205, tailored to substantially completely remove the layer 240 above the first device region 210.

FIG. 2d schematically illustrates the measurement site 260 after the etch process 205, wherein, in some illustrative embodiments, a portion of the layer 240 may be covered by the mask 204 similar to the situation in FIG. 2a, while a corresponding portion may be exposed to the etch ambient of the process 205, while, in other illustrative embodiments, the entire measurement site 260 may be exposed to the etch process 205. Based on appropriate measurement techniques, such as scanning the measurement site 260 by an atomic force microscope (AFM) or by other profilometers as are well known in the art, a corresponding step height S may be determined, which indicates the effect of the etch process 205. In other cases, the remaining layer thickness after the etch process 205 may be determined on the basis of optical measurement techniques similar to the process 261. Thus, the respective measurement data, such as the step height S, may represent a measure of the effective etch rate during the process 205, which, in turn, characterizes the corresponding etch ambient of the respective etch tool or etch chamber, in which the process 205 has been performed. Consequently, the measurement data obtained from the measurement site 260 after the etch process 205 may also be used for the etch process 205 to be performed for a further substrate 201, since the respective measurement data may indicate the present status of the respective etch ambient of the process 205, at least at the time of performing the process 205 for patterning the measurement site 260 of the respective substrate 201 under consideration. Except for a certain delay for obtaining the respective feedback data, corresponding fluctuations in the etch ambient and thus etch rate may be efficiently compensated for. In some illustrative embodiments, appropriate advanced process control (APC) strategies may therefore be used, which may have a model and therefore provide predictive behavior, even if respective measurement data are supplied with a certain delay.

Figure 2E:
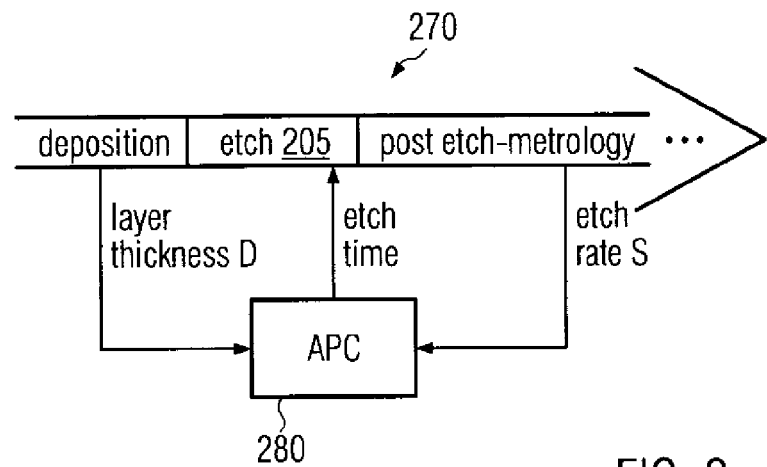
FIG. 2e schematically illustrates a process flow and a control strategy for implementing an etch time controlled etch process according to illustrative embodiments.

FIG. 2e schematically illustrates an illustrative process flow for forming the semiconductor device 200 on the basis of an appropriate APC strategy. The process flow, indicated as 270, may include the process sequence as previously described for the device 200 wherein, for convenience, the deposition process for forming the second stress-inducing layer 240 is illustrated as the first process. The deposition process may include the subsequent determination of the layer thickness, for instance on the basis of the measurement site 260 and the process 261 (FIG. 2c), and the respective measurement data may be supplied to a controller 280, which, in one illustrative embodiment, may have implemented therein an APC strategy in order to establish an appropriate process parameter value, that is, an appropriate etch time for the subsequent etch process 205 on the basis of the layer thickness data obtained. In some illustrative embodiments, the controller 280 may further receive post-etch metrology data, such as the step height S or the layer thickness after the etch process (FIG. 2d), which has encoded therein the status of the respective etch ambient used in the preceding etch process 205. Thus, by assessing the etch rate, i.e., the step height S, and the initial layer thickness D, the controller 280 may provide a target etch time for the etch process 205 of a subsequent semiconductor device 200 adapted to current or predicted current status of the etch process 205, thereby substantially compensating process fluctuations during the deposition of the layer 240 and during the etch process 205.

For example, the controller 280 may have implemented therein a linear model of the etch process:

$$D = t*R;$$

$$S = t^0 * R^0$$

$$t^{target} = t^0 + \text{delta}*R^0; \text{delta} = D-S;$$

with D and S as the measurement values for the pre-etch layer thicknesses and the post-etch step height, respectively; t, R as the predicted etch time and etch rate; $t^0$, $R^0$ as the previously used etch time and etch rate; and $t^{target}$ as the target etch time.

Thus, the step height S is determined by the etch time t and the etch rate R. Consequently, the etch rate $R^0$ of a preceding etch process 205 may be determined on the basis of the corresponding etch time $t^0$ used and the measured step height S or layer thickness after the etch process, and a corresponding target etch time $t^{target}$ may be determined on the basis of the previously used etch time and a corresponding measurement value of the present layer thickness D and a layer thickness obtained for the previously processed device, wherein it may be assumed that the current etch rate may be substantially determined by the measurement data relating to the previously processed device. Consequently, the new target etch time may be established so as to obtain a step height of approximately zero for the presently measured layer thickness D of the presently processed substrate. It should be appreciated that, for enhanced controller stability, respective measures may be taken, such as using a moving average, such as an exponential weighted moving average (EWMA), for appropriately weighting the etch rate used in the model of the controller 208. However, any other appropriate control regimes may be used in other illustrative embodiments.

Consequently, reliable material removal during the etch process 205 may be provided on the basis of feed forward data, i.e., the layer thickness measurement data D and feed back data, i.e., data indicating the etch rate, such as step height S or layer thickness after etch, wherein well-established metrology techniques may be used. Hence, the process flow 270 may provide enhanced reliability and uniformity of the corresponding semiconductor devices substantially without reducing overall throughput and substantially without adding additional process complexity, since no additional manufacturing processes may be required. Instead, a deposition process for forming a respective etch indicator layer may be omitted, which may enhance throughput in the sequence 270.

Figure 3A:
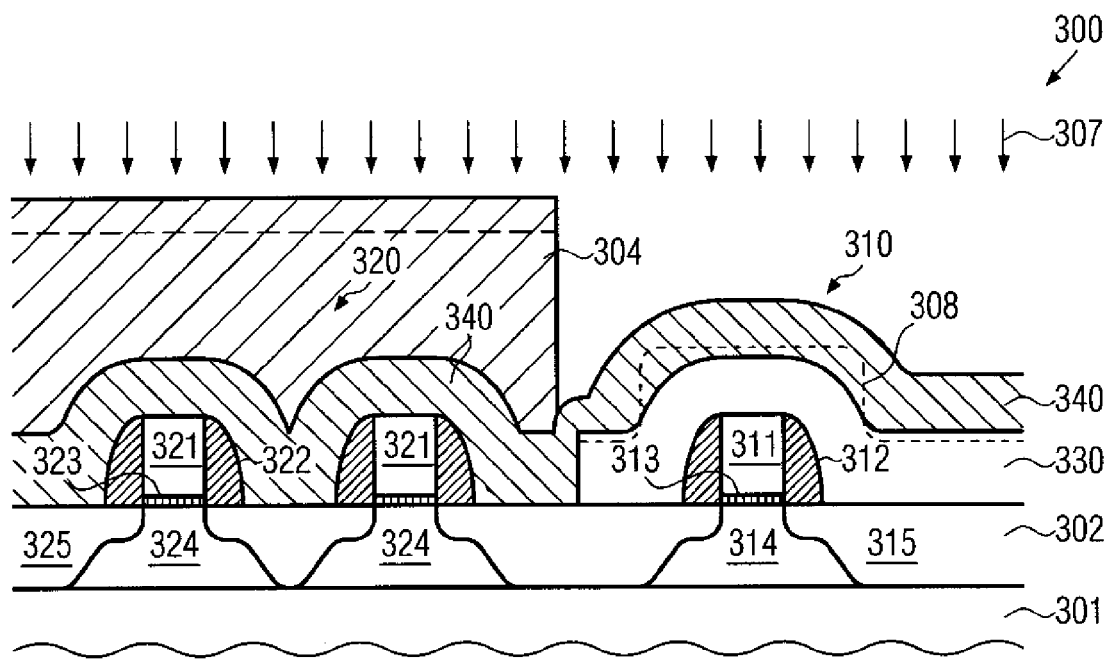
FIG. 3a schematically illustrates a cross-sectional view of a semiconductor device during the formation of different types of stress-inducing layers on the basis of an indicator material incorporated into the dielectric material according to further illustrative embodiments.
Figure 3B:
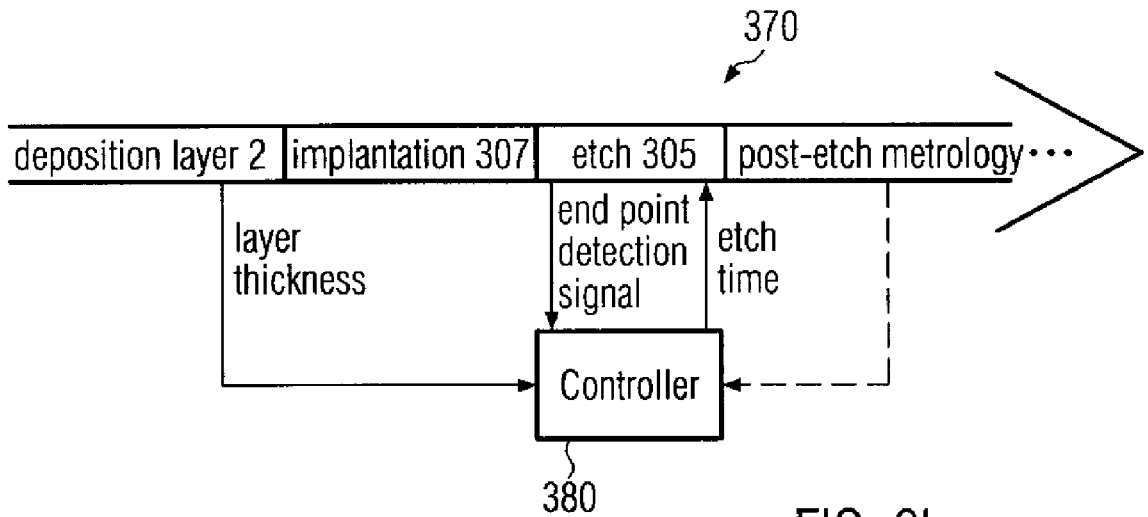
FIGS. 3b-3c schematically illustrate respective process flows and control strategies for forming the device of FIG. 3a according to yet other illustrative embodiments.
Figure 3C:
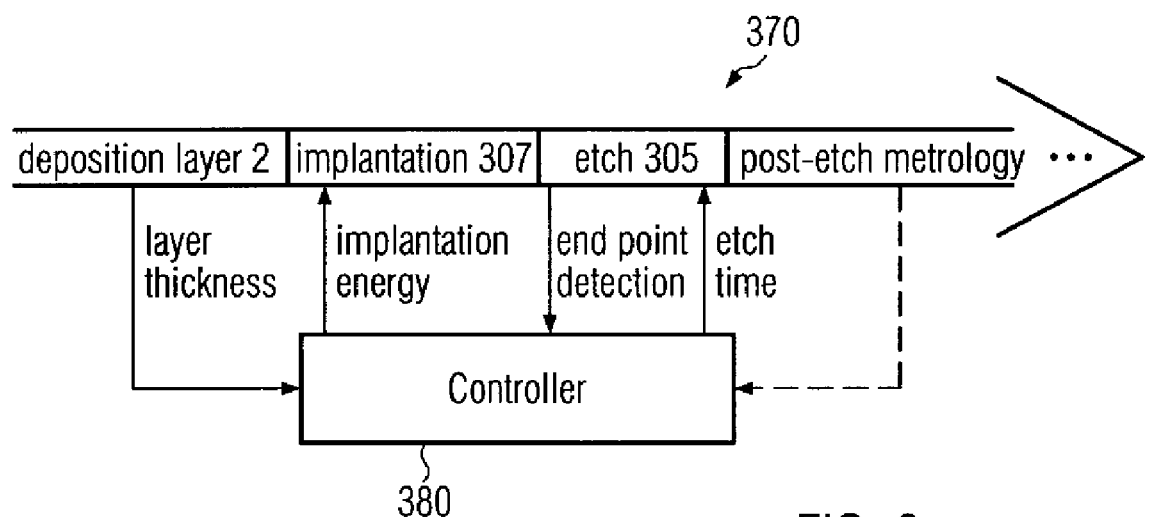

With reference to FIGS. 3a-3c, further illustrative embodiments will now be described in which, additionally or alternatively to providing respective measurement data for estimating the etch rate, an etch indicator material may be used for enhancing the determination of an appropriate etch time for the corresponding etch process.

FIG. 3a schematically illustrates a semiconductor device 300, which may have substantially the same configuration as the device 200 as shown in FIG. 2a, except for a respective indicator material. Hence, respective components of the semiconductor device 300 are denoted with the same reference numerals, wherein the leading digit "2" is replaced by "3" and a corresponding explanation of these components may be omitted. Different than the situation shown in FIG. 2a, the device 300 may be subjected to an ion implantation process 307 that may be performed on the basis of the mask 304 prior to performing a corresponding etch process in order to remove the exposed portion of the second stress-inducing layer 340. The ion implantation process 307 may be performed on the basis of an appropriate implantation species which may provide a pronounced optical emission signal, that is, an efficiently detectable endpoint detection signal, during a respective etch process. For example, any appropriate species, such as metals, dielectric components and the like, may be used which emit or absorb a well-detectable wavelength. In order to appropriately position the implant species at a desired depth within the dielectric material of the layers 330 and 340, an appropriate average penetration depth may be used, i.e., the corresponding implantation energy may be determined in order to obtain the required penetration depth. For this purpose, well-established simulation techniques may be used or appropriate tests may be performed. It should be appreciated that the high detectability of the corresponding implant species may enable the use of a very low implantation dose so as to maintain any detrimental effects of the implantation 307 at a low level. It should be appreciated that the corresponding implantation species 308 may also be incorporated into the mask 304, however at a different depth due to the very different blocking capability of the mask 304 compared to the highly dense dielectric material of the layers 340, 330. Thus, in the subsequent etch process, wherein the removal rate of the mask 304 may be significantly less compared to the removal rate for the dielectric material of the layer 340, the species 308 incorporated therein is preferentially released into the etch ambient while the corresponding species 308 in the mask 304 may remain substantially confined. Hence, during the etch process 308, the released species may provide a corresponding endpoint detection signal which, in combination with the layer thickness of the layer 340, may be used to establish an appropriate etch time for the corresponding etch process.

FIG. 3b schematically illustrates the process flow 370 according to illustrative embodiments wherein the controller 380 may obtain respective measurement data relating to the thickness of the layer 340. Furthermore, the process flow 370 may comprise the implantation process 307, followed by the etch process for removing the exposed portion of the layer 340, wherein a corresponding endpoint detection signal may be supplied to the controller 380. Since, for a given implantation energy of the process 307, the absolute height position of the species 308 may depend on the initial layer thickness, the controller 380 may determine an appropriate etch time in order to substantially completely remove the exposed portion of the layer 340. For instance, if a process variation during the deposition process may result in an increased layer thickness, the corresponding species 308 may be positioned within the layer 340, thereby requiring an additional "over-etch" time in order to substantially completely remove the material. In this case, the controller 380 may determine an appropriate target etch time for this case. It should be appreciated that, in this process regime, the average penetration depth may be selected so as to result in the deposition of the species 308 within the layer 340 even for moderately high process fluctuations during the deposition so that a reduced layer thickness may nevertheless provide a significant endpoint detection signal. It should further be appreciated that the species 308 may be released during an extended period of the etch process, since the species 308 may be positioned at varying distances with respect to the corresponding surface of the layer 340 due to the surface topography and thus may be released at different phases of the etch process. For instance, the species 308 may be positioned closer to the surface of the layer 340 at substantially vertical device portions compared to substantially horizontal areas. However, the respective profile of the endpoint detection signal may nevertheless be appropriately assessed so as to obtain information on the progression of the etch process. For example, a significant decrease of the endpoint detection signal may indicate that the etch front has reached the horizontally extending implant region of the species 308.

FIG. 3c schematically illustrates the process flow 370 according to further illustrative embodiments. In these cases, a respective control strategy, which may be implemented in the controller 380, may also control the implantation energy of the implantation process 307 on the basis of respective thickness measurement data related to the layer 340. That is, for any variations in layer thickness, the corresponding implantation energy and thus the mean penetration depth may be adapted so as to position the species 308, at least at horizontal device portions, at a desired depth, for instance substantially at an interface between the first layer 330 and the second layer 340. Thereafter, the etch process may be performed and the respective endpoint detection signal may be assessed so as to determine an appropriate etch time and thus endpoint of the etch process.

It should be appreciated that the process flow 370, as illustrated in FIGS. 3b and 3c, may also be performed on the basis of respective post-etch measurement data, as indicated by the dashed arrows, in order to further enhance the control performance of the respective control strategies in order to detect long term variations of the etch process.

As a consequence, by incorporating the species 308, for instance on the basis of the implantation process 307, the control strategy may be less dependent on fluctuations of the respective etch process since the respective endpoint detection signal may provide a certain indication of the presently existing etch conditions. On the other hand, any drifts of the respective etch conditions may be efficiently monitored and compensated for by post-etch measurement data, such as the step height S and the like, as previously explained, wherein the degree of delay in supplying the corresponding measurement data may be less critical. The process flow 370 as shown in FIG. 3c may provide an enhanced independence from any etch rate variations, since the corresponding species 308 may be positioned at an interface between the first and second layers 330, 340 thereby providing the endpoint detection signal at the very final state of the etch process, substantially without requiring any additional extended over-etch times in which variations of the etch rate might have an influence on process uniformity.

Figure 4A:
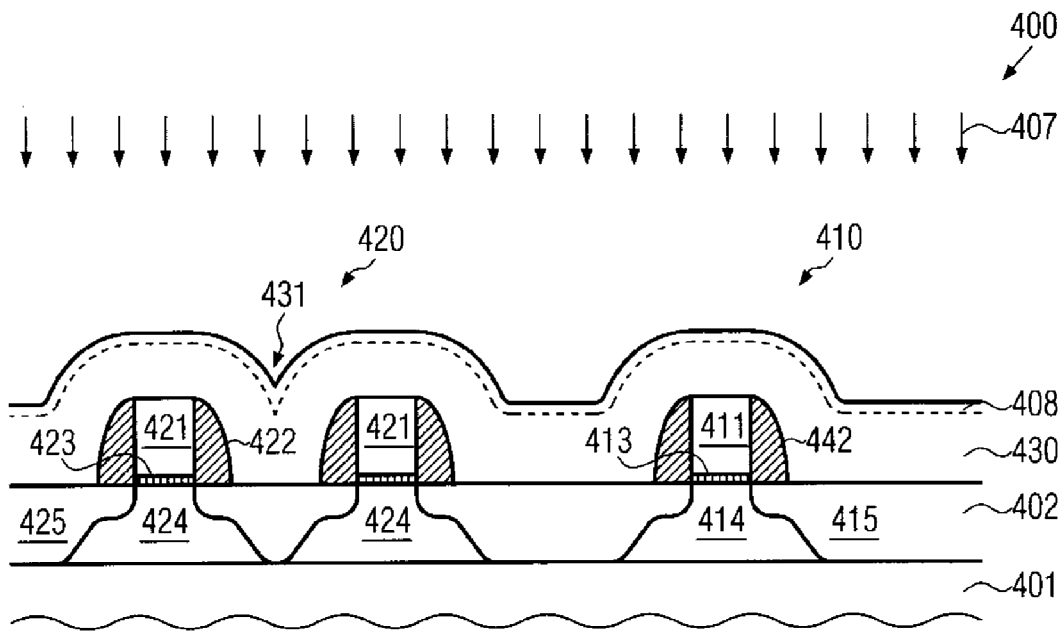
FIGS. 4a-4b schematically illustrate cross-sectional views of a semiconductor device during a sequence for forming different types of stress-inducing layers on the basis of an indicator material incorporated into the first stress-inducing layer according to yet other illustrative embodiments.
Figure 4B:
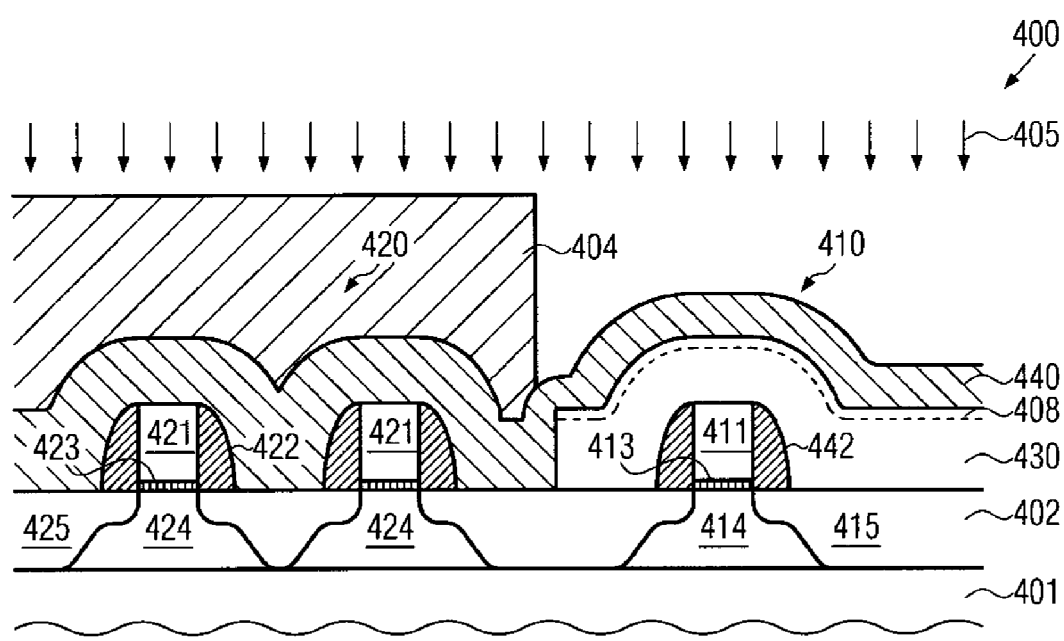

With reference to FIGS. 4a-4b, further illustrative embodiments will now be described, wherein an appropriate etch indicator material may be incorporated into the first stress-inducing layer.

FIG. 4a schematically illustrates a cross-sectional view of a semiconductor device comprising a substrate 401, a semiconductor layer 402 and respective first and second device regions 410, 420, similar to the previously described semiconductor devices 100, 200 and 300. The respective transistor elements in the first and second device regions 410, 420 may have substantially the same configuration as previously described and hence any explicit description of these components may be omitted. Furthermore, in this manufacturing stage, a first stress-inducing layer 430 may be formed above the first and second device regions 410, 420, wherein the layer 430 may have a configuration as previously described with reference to the respective layer 130, 230 and 330. Furthermore, the semiconductor device 400 is subjected to a process 407 for incorporating an indicator species 408 into the surface area of the layer 430. That is, the process 407, for instance, a low energy implantation or a plasma treatment, may be performed on the basis of process parameters such as implantation energy adjusted to obtain a low mean penetration depth for the species 408. The species 408 may represent any appropriate species that provides an efficiently detectable endpoint detection signal, even if provided in a moderately low concentration. Consequently, the incorporation of the species 408 by the process 407 may not significantly modify the overall characteristics of the layer 430. Thereafter, the layer 430 may be removed from the second device region 420 on the basis of a process strategy as previously explained.

It should be appreciated that the corresponding removal of the layer 430 may not be substantially affected by the presence of the species 408 due to the moderately low concentration so that a corresponding etch process may progress with high uniformity, even at critical areas, such as an area 431.

FIG. 4b schematically illustrates the semiconductor device 400 in a further advanced manufacturing stage. A second stress-inducing layer 440 is formed above the second device region 420 and on the first layer 430 having incorporated at a surface area thereof the species 408. Furthermore, an etch mask 404 is provided for covering the second device region 420. With respect to any process techniques for forming the device 400 as shown in FIG. 4b, it may be referred to the devices 200 and 300. Thereafter, an etch process 405 may be performed, wherein the species 408 may be released during the advance of the etch front when removing material of the layer 440. Depending on the penetration depth of the species 408, a certain amount of material of the layer 430 in the vicinity of the interface of the layers 430, 440 may also be removed.

Figure 4C:
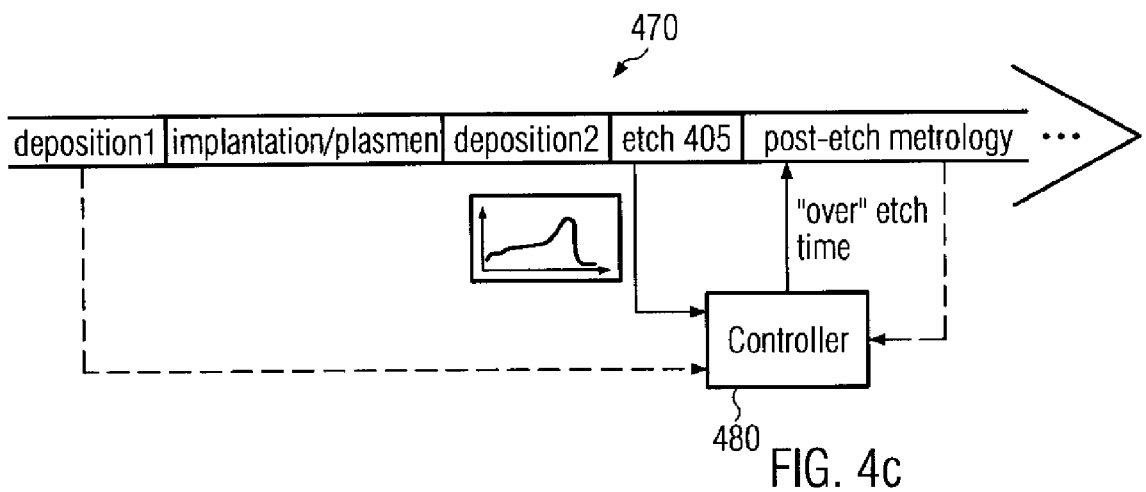
FIGS. 4c-4d schematically illustrate respective process flows and process strategies related to the process sequence as shown in FIGS. 4a-4b according to illustrative embodiments.

FIG. 4c schematically illustrates a corresponding process flow 470 including the deposition (1) of the first layer 430 followed by the process 407 for incorporating the species 408. Thereafter, the deposition of the layer 440 is performed and the etch process 405 may follow, thereby producing a respective endpoint detection signal having a respective progression over time, from which the controller 480 may determine an appropriate etch time and end of the respective process 405. As previously explained, post-etch measurement data may also be provided to the controller 480 in order to determine any "long-term" variations in the etch processes 405, thereby further enhancing the control efficiency in the flow 470.

Figure 4D:
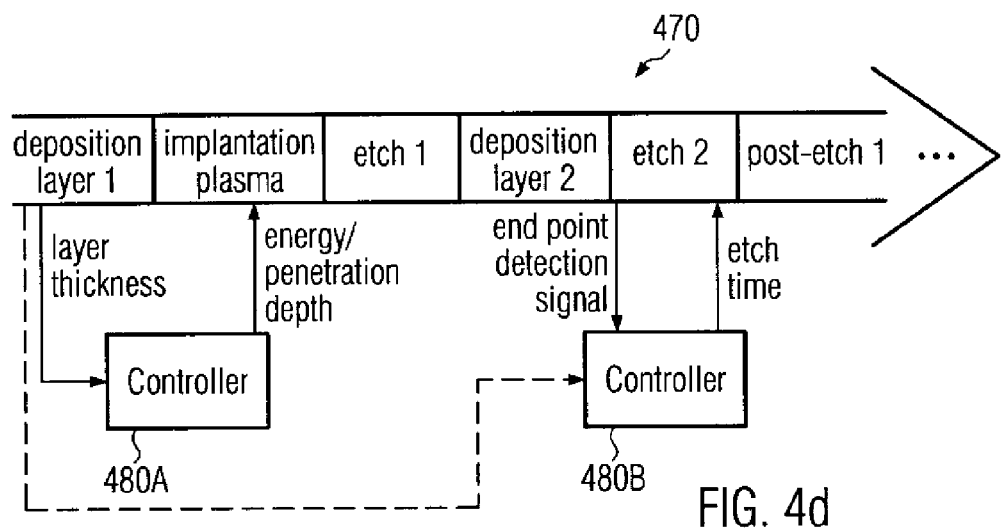

FIG. 4d schematically illustrates the process flow 470 according to further illustrative embodiments. In this strategy, the layer thickness of the deposition process for forming the first layer 430 may be determined and may be used in controlling the corresponding process 407 for incorporating the species 408. In this way, the final thickness of the first layer 430 may be adjusted irrespective of any thickness fluctuations during the deposition, since, by appropriately adjusting the penetration depth of the species 408, the amount of material of the first layer 430 may be adjusted which may also be removed during the etch process 405. Thereafter, the process flow 470 may be performed as previously described, i.e., by etching the first layer 430, depositing the second layer and performing the etch process 405, wherein the corresponding endpoint detection signal may be used by the controller 480B so as to determine an appropriate overall etch time and in particular the end of the corresponding etch process 405. Consequently, also in the process flows 470, an improved direct response to any variations of the respective etch process 405 may be obtained while nevertheless substantially avoiding any negative impacts of the indicator species 408. Furthermore, the respective process complexity may be comparable to conventional strategies since an additional process for incorporating the indicator species may have to be performed while, however, a corresponding deposition process for an etch indicator layer may be omitted. As described above, also in this case, long-term drifts of the respective etch processes may be controlled on the basis of respective post-etch measurement data, if required.

As a result, the embodiments disclosed herein may provide an enhanced process strategy in forming differently stressed dielectric layers, such as silicon nitride layers above respective transistor elements, wherein negative impacts of a deposition process conventionally performed to provide an etch indicator layer may be substantially avoided. For this purpose, the deposition process may be omitted and the corresponding patterning process for removing an unwanted portion of the second stress-inducing layer may be performed as an etch time controlled process, for instance based on feed back and feed forward measurement data, thereby taking into consideration respective process fluctuations during the deposition of the stress-inducing layer and any fluctuations of the etch process. For this purpose, APC strategies may be used, wherein the post-etch measurement data, such as step height data, layer thickness data and the like, may indicate the etch conditions of respective process tools with respect to the etch rate, while the corresponding pre-etch measurement data, that is, the layer thickness of the second stress-inducing layer, may characterize the corresponding process fluctuations in the deposition process. By providing respective categorized measurement data, each category representing a respective process flow thread based on specific process tools, a high degree of controllability and thus reliability of the corresponding etch process may be obtained, even if a plurality of different process tools are used in processing the respective semiconductor devices, as is typically the case in complex manufacturing environments. In other strategies, the controllability and in particular the response time to any fluctuations of the etch rate may be enhanced by incorporating an appropriate etch indicator species substantially without avoiding any undue effects on other process steps. For instance, appropriate indicator species may be incorporated with low concentration while nevertheless providing an efficiently detectable endpoint detection signal, which may then be used for determining an appropriate overall etch time.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first stress-inducing layer above a first transistor and a second transistor;
   removing a portion of said first stress-inducing layer located above said second transistor;
   forming a second stress-inducing layer on said first stress-inducing layer;
   removing a portion of said second stress-inducing layer from above said first transistor on the basis of an etch time controlled etch process;
   providing a specified species in at least one of the first or second stress-inducing layers and controlling said etch time controlled etch process on the basis of an optical signal obtained from said specified species during said etch time controlled etch process.

2. The method of claim 1, further comprising controlling said etch time controlled etch process on the basis of measurement data indicating a layer thickness of said second stress-inducing layer.

3. The method of claim 2, further comprising obtaining post-etch measurement data relating to an etch rate of said etch time controlled etch process performed on a previously processed substrate.

4. The method of claim 3, wherein obtaining said post-etch measurement data comprises determining a step height in said previously processed substrate, said step height generated during said etch time controlled etch process.

5. The method of claim 3, wherein controlling said etch time controlled etch process further comprises determining a target etch time at least on the basis of said post-etch measurement data and using said target etch time for processing one or more substrates having formed thereabove said first and second stress-inducing layers.

6. The method of claim 1, further comprising forming an etch stop layer above said first and second transistors prior to forming said first stress-inducing layer.

7. The method of claim 1, wherein said first and second stress-inducing layers are comprised of silicon nitride.

8. The method of claim 1, further comprising forming a dielectric material above said first and second transistors after said etch time controlled etch process, and forming contacts in said dielectric material and said first and second stress-inducing layers.

9. The method of claim 1, wherein providing said specified species further comprises said specified species in at least the second stress-inducing layer.

10. The method of claim 1, wherein providing said specified species further comprises introducing said specified species in a layer located near a surface of said first stress-inducing layer prior to forming said second stress-inducing layer.

11. The method of claim 1, further comprising controlling said etch time controlled etch process on a run-to-run basis.

12. The method of claim 11, wherein controlling said etch time controlled etch process on a run-to-run basis further comprises controlling said etch time controlled etch process based on feedback measurement data comprising step height measurement data collected from runs of the etch time controlled etch process.

13. A method comprising:
    implanting a species with a specified energy into a dielectric material formed above a first transistor and a second transistor, said dielectric material being comprised of a first stress-inducing layer selectively formed above said first transistor and a second stress-inducing layer formed on said first stress-inducing layer and above said second transistor; and
    removing said second stress-inducing layer from said first stress-inducing layer on the basis of an etch process controlled on the basis of a signal generated by said implanted species.

14. The method of claim 13, further comprising obtaining measurement data relating to at least a thickness of said second stress-inducing layer and controlling said etch process on the basis of said measurement data.

15. The method of claim 13, wherein said species is implanted prior to forming an etch mask used to remove an exposed portion of said second stress-inducing layer formed on said first stress-inducing layer.

16. The method of claim 13, wherein said species is implanted after forming an etch mask covering said first transistor while exposing said second transistor.

17. The method of claim 13, further comprising obtaining post-etch measurement data from at least one previously processed substrate, said post-etch measurement data indicating an etch rate during said etch process when performed on said at least one previously processed substrate.

18. The method of claim 13, further comprising obtaining measurement data relating to at least a thickness of said second stress-inducing layer and selecting said specified energy on the basis of said measurement data.

19. The method of claim 13, wherein said first and second stress-inducing layers are comprised of substantially the same atomic species.

20. A method, comprising:
    forming a first dielectric layer above a first transistor and a second transistor;
    introducing an indicator species into said first dielectric layer to a specified mean penetration depth;
    removing said first dielectric layer from above said second transistor;
    forming a second dielectric layer on said first dielectric layer and above said second transistor; and
    removing said second dielectric layer from said first dielectric layer by an etch process controlled on the basis of a signal generated by said indicator species.

21. The method of claim 20, further comprising determining a deposition thickness of said first dielectric layer and selecting said mean penetration depth on the basis of the determined deposition thickness.

22. The method of claim 20, wherein said first and second dielectric layers contain silicon nitride.

23. The method of claim 20, wherein said first dielectric layer has an intrinsic stress of a different type compared to an intrinsic stress of said second dielectric layer.

* * * * *